(12) United States Patent
Chen

(10) Patent No.: US 12,158,484 B2
(45) Date of Patent: Dec. 3, 2024

(54) SIGNAL DETECTOR CIRCUIT AND SIGNAL DETECTION METHOD

(71) Applicant: Realtek Semiconductor Corp., HsinChu (TW)

(72) Inventor: Bing-Hung Chen, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 137 days.

(21) Appl. No.: 17/953,274

(22) Filed: Sep. 26, 2022

(65) Prior Publication Data

US 2023/0258697 A1   Aug. 17, 2023

(30) Foreign Application Priority Data

Feb. 17, 2022   (TW) .................................. 111105753

(51) Int. Cl.
  *G01R 19/04*   (2006.01)
  *G01R 19/165*  (2006.01)

(52) U.S. Cl.
  CPC ....... *G01R 19/16585* (2013.01); *G01R 19/04* (2013.01)

(58) Field of Classification Search
  CPC .. G01R 19/16585; G01R 19/04; G01R 31/11; G01R 31/085; H03F 1/02; H03F 1/32; H03F 3/19
  USPC ..... 324/140 R, 500, 600, 534, 76.11, 763.01
  See application file for complete search history.

(56) References Cited

U.S. PATENT DOCUMENTS

| | | | |
|---|---|---|---|
| 7,512,183 B2 * | 3/2009 | Haridass | H03F 3/45197 375/295 |
| 2004/0212401 A1 | 10/2004 | Chien | |
| 2004/0214536 A1 * | 10/2004 | Chien | G01R 19/04 455/127.2 |
| 2013/0195155 A1 * | 8/2013 | Pan | H03D 1/00 375/317 |

FOREIGN PATENT DOCUMENTS

WO   2010/120562 A2   10/2010

* cited by examiner

*Primary Examiner* — Alexander Satanovsky
*Assistant Examiner* — Trung Q Nguyen
(74) *Attorney, Agent, or Firm* — Winston Hsu

(57) ABSTRACT

A signal detector circuit includes a signal peak detector circuit, a reference voltage generation circuit, and a comparator circuit. The signal peak detector circuit is arranged to receive a plurality of differential voltage input signals, and generate a single-ended peak signal according to the plurality of differential voltage input signals. The reference voltage generation circuit is arranged to generate a single-ended reference voltage signal. The comparator circuit is arranged to receive the single-ended peak signal and the single-ended reference voltage signal, and compare the single-ended peak signal with the single-ended reference voltage signal to generate a signal detection result.

10 Claims, 5 Drawing Sheets

SIGNAL DETECTOR CIRCUIT AND SIGNAL DETECTION METHOD

BACKGROUND OF THE INVENTION

1. Field of the Invention

The present invention is related to signal detection, and more particularly, to a signal detector circuit with low input parasitic capacitance and an associated signal detection method.

2. Description of the Prior Art

In a chip related to a communications system, a signal detector circuit is usually coupled to a high speed signal path for determining whether a signal from other devices is received, wherein said signal may be used for subsequent operations. The signal detector circuit will generate some input parasitic capacitance. A magnitude of this input parasitic capacitance will affect signal quality of high speed signal transmissions. For a typical signal detector circuit, an architecture will operate according to input common mode voltage. Since the optimum common mode operating voltage of the input stage of the signal detector circuit is not necessarily the same as the optimum common mode operating voltage of the high speed signal path, the typical signal detector circuit additionally requires a common mode voltage re-biasing circuit, wherein the common mode voltage re-biasing circuit utilizes capacitive coupling and resistive re-biasing to regenerate a common mode bias voltage. Realization of the layout capacitive coupling, however, will generate a large amount of parasitic capacitance to ground. In addition, the common mode voltage re-biasing circuit will occupy a large area of the chip.

The typical signal detector circuit will utilize a differential comparator which compares a differential input signal with a differential reference voltage signal for determining whether the signal from other devices is received. The common mode voltage of all inputs of the differential comparator is required to be the same, however. To address this problem, the typical signal detector circuit additionally requires a reference voltage generation circuit capable of making the common mode voltage of the differential reference voltage signal the same as the common mode voltage of the differential input signal, wherein this reference voltage generation circuit will also occupy a large area of the chip. As a result, a signal detector circuit with low input parasitic capacitance which can maintain quality of the high speed data transmission and reduce the chip area at the same time is urgently needed.

SUMMARY OF THE INVENTION

It is therefore an objective of the present invention to provide a signal detector circuit with low input parasitic capacitance and an associated signal detection method, to address the above-mentioned problems.

According to an embodiment of the present invention, a signal detector circuit is provided. The signal detector circuit may include a signal peak detector circuit, a reference voltage generation circuit, and a comparator circuit. The signal peak detector circuit may be arranged to receive a plurality of differential voltage input signals, and generate a single-ended peak signal according to the plurality of differential voltage input signals. The reference voltage generation circuit may be arranged to generate a single-ended reference voltage signal. The comparator circuit may be arranged to receive the single-ended peak signal and the single-ended reference voltage signal, and compare the single-ended peak signal with the single-ended reference voltage signal to generate a signal detection result.

According to another embodiment of the present invention, a signal detection method is provided. The signal detection method may include: receiving a plurality of differential voltage input signals; generating a single-ended peak signal according to the plurality of differential voltage input signals; generating a single-ended reference voltage signal; and comparing the single-ended peak signal with the single-ended reference voltage signal to generate a signal detection result.

One of the benefits of the present invention is that, since the signal detector circuit of the present invention utilizes architecture that does not operate according to input common mode voltage, an additional common mode voltage generation circuit is not required, and a reference voltage generation circuit to make the common mode voltage of the differential reference voltage signal the same as that of the differential input signal is also not required. In this way, the signal detector circuit of the present invention can reduce an amount of parasitic capacitance affecting the high speed signal, to maintain the signal quality of high speed data transmission as well as reducing the chip area. In addition, the signal detector circuit of the present invention adopts single-ended detection, which can reduce the parasitic capacitance of the input terminal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
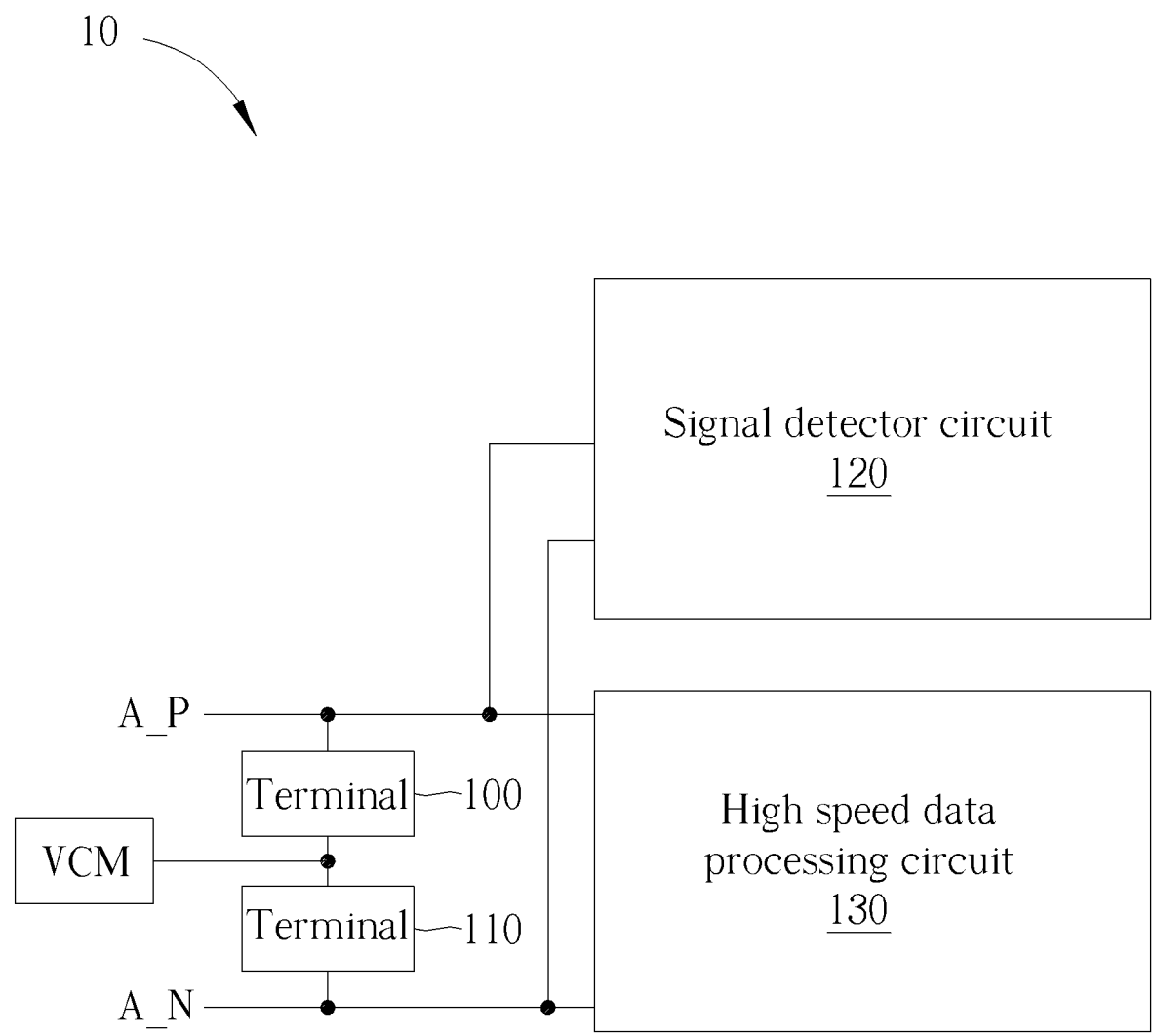
FIG. 1 is a diagram illustrating a high speed data processing architecture according to an embodiment of the present invention.

FIG. 1 is a diagram illustrating a high speed data processing architecture 10 according to an embodiment of the present invention. As shown in FIG. 1, the high speed data processing architecture 10 may include a plurality of terminals 100 and 110, a signal detector circuit 120, and a high speed data processing circuit 130 (e.g. a high speed data amplifier and a clock data recovery (DCR) circuit), wherein the terminals 100 and 110 may be two terminal resistors, but the present invention is not limited thereto. A first end of the terminal 100 may be coupled to a common mode voltage VCM, and a second end of the terminal 100 may be arranged to receive a differential voltage input signal A_P corresponding to high speed input data, wherein the common mode voltage VCM is the optimum common mode operating voltage of the high speed data processing circuit 130. A first end of the terminal 110 may be coupled to the common mode voltage VCM, and a second end of the terminal 110 may be arranged to receive another differential voltage input signal A_N corresponding to the high speed input data. The signal detector circuit 120 may be coupled to the second end of the terminal 100 and the second end of the terminal 110, and may be arranged to receive the differential voltage input signals A_P and A_N, and determine whether the differential voltage input signals A_P and A_N are noise. The high speed data processing circuit 130 may be coupled to the second end of the terminal 100 and the second end of the terminal 110, and may be arranged to process valid data transmitted by the differential voltage input signals A_P and A_N.

Figure 2:
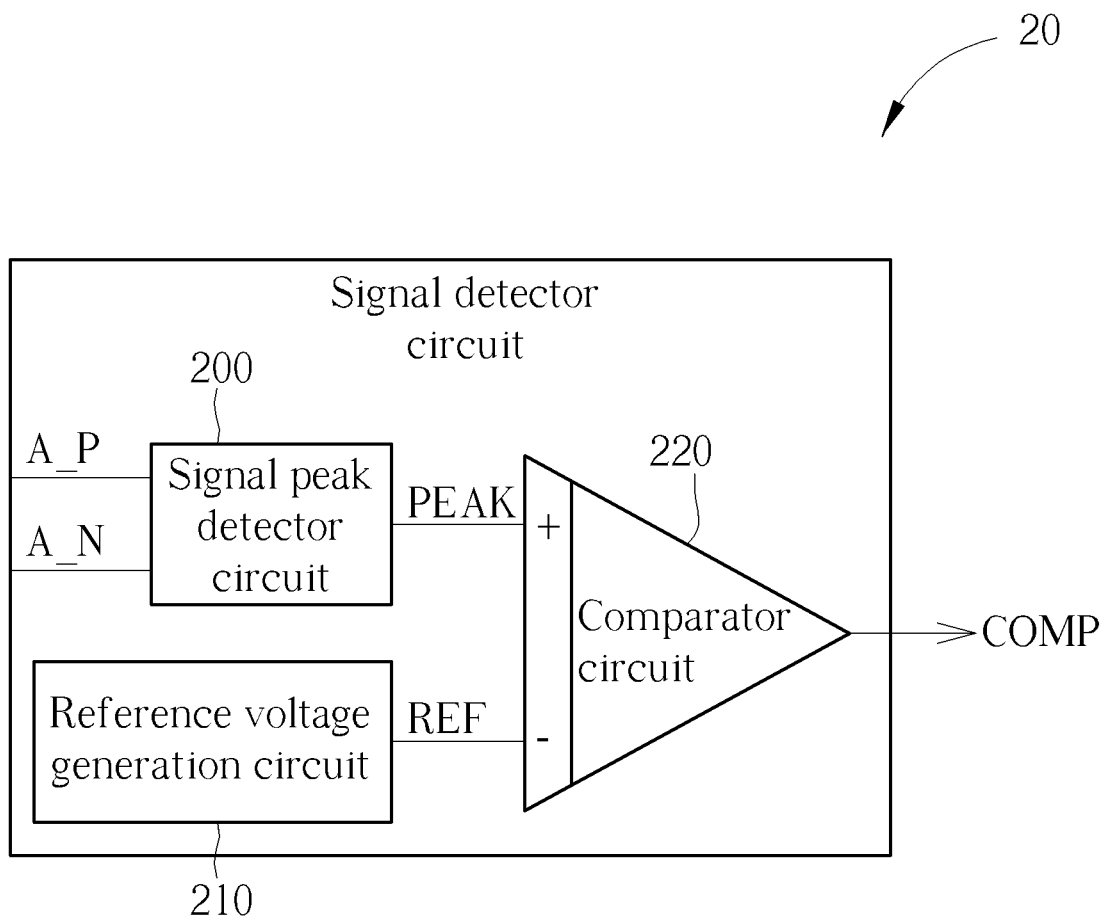
FIG. 2 is a diagram illustrating a signal detector circuit according to an embodiment of the present invention.

FIG. 2 is a diagram illustrating a signal detector circuit 20 according to an embodiment of the present invention, wherein the signal detector circuit 120 shown in FIG. 1 may be implemented by the signal detector circuit 20 shown in FIG. 2. As shown in FIG. 2, the signal detector circuit 20 may include a signal peak detector circuit 200, a reference voltage generation circuit 210, and a comparator circuit 220. The signal peak detector circuit 200 may be arranged to receive the differential voltage input signals A_P and A_N, and sample and hold the differential voltage input signals A_P and A_N, to generate a single-ended peak signal PEAK. It should be noted that the signal peak detector circuit 200 only operates according to the differential voltage of the input signal (i.e. the differential voltage input signals A_P and A_N), and will not perform subsequent operations using the common mode voltage of the input signal. As a result, the signal peak detector circuit 200 utilizes architecture that does not operate according to the input common mode voltage, and an additional common mode voltage generation circuit is therefore not required for the signal detector circuit 20. In this way, the chip area occupied by the common mode voltage generation circuit can be saved, and parasitic capacitance generated by the common mode voltage generation circuit can be avoided. In addition, in order to reduce the parasitic capacitance of the input terminal, the signal peak detector circuit 200 adopts single-ended detection to generate the single-ended peak signal PEAK. In this way, compared with a signal detector circuit with architecture that operates according to the common mode voltage, the signal detector circuit 10 can reduce the parasitic capacitance of the input terminal by half. As a result, the signal quality of high speed data transmission can be improved.

The reference voltage generation circuit 210 may be arranged to generate a single-ended reference voltage signal REF. Since the signal peak detector circuit 200 utilizes architecture that does not operate according to the input common mode voltage, the reference voltage generation circuit 210 only needs to generate the single-ended reference voltage signal REF according to circuit design requirements, without considering the problem of common mode voltage variation between the single-ended reference voltage signal REF and the single-ended peak signal PEAK. The comparator circuit 220 has a positive end coupled to the signal peak detector circuit 200 and a negative end coupled to the reference voltage generation circuit 210, and may be arranged to receive the single-ended peak signal PEAK and the single-ended reference voltage signal REF, and compare the single-ended peak signal PEAK with the single-ended reference voltage signal REF to generate a signal detection result COMP, wherein it is determined whether the differential voltage input signals A_P and A_N are noise according to the signal detection result COMP.

Figure 3:
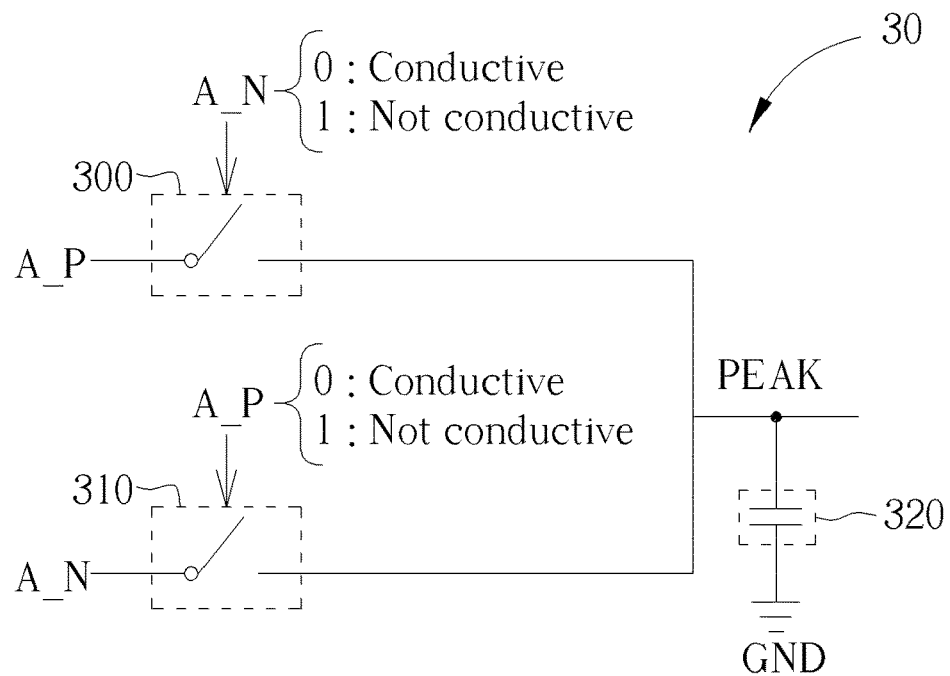
FIG. 3 is a diagram illustrating a signal peak detector circuit according to an embodiment of the present invention.

FIG. 3 is a signal peak detector circuit 30 according to an embodiment of the present invention, wherein the signal peak detector circuit 200 shown in FIG. 2 may be implemented by the signal peak detector circuit 30 shown in FIG. 3. As shown in FIG. 3, the signal peak detector circuit 30 may include a switch circuit 300, a switch circuit 310, and a capacitance 320, wherein the switch circuits 300 and 310 may be implemented by active components (e.g. transistors). The switch circuit 300 has a first end and a second end, wherein the first end of the switch circuit 300 may be arranged to receive the differential voltage input signal A_P, and the switch circuit 300 may determine whether to be conductive according to the differential voltage input signal A_N, in order to transmit the differential voltage input signal A_P to the second end of the switch circuit 300. The switch circuit 310 has a first end and a second end, wherein the first end of the switch circuit 310 may be arranged to receive the differential voltage input signal A_N, and the switch circuit 310 may determine whether to be conductive according to the differential voltage input signal A_P, in order to transmit the differential voltage input signal A_N to the second end of the switch circuit 310. As a result, the differential voltage input signal A_P received by the switch circuit 300 further acts as a control signal of the switch circuit 310, and the differential voltage input signal A_N received by the switch circuit 310 further acts as a control signal of the switch circuit 300. The capacitance 320 has a first end and a second end, and may be arranged to output the single-ended peak signal PEAK, wherein the first end of the capacitance 320 may be coupled to the second end of the switch circuit 300 and the second end of the switch circuit 310, and the second end of the capacitance 320 may be coupled to a reference voltage (i.e. a ground voltage GND).

In this embodiment, when the differential voltage input signal A_P is a high level (labeled as "1") and the differential voltage input signal A_N is a low level (labeled as "0"), the switch circuit 300 is conductive and the switch circuit 310 is not conductive, and the single-ended peak signal PEAK is the differential voltage input signal A_P at this point. When the differential voltage input signal A_P is the low level and the differential voltage input signal A_N is the high level, the switch circuit 300 is not conductive and the switch circuit 310 is conductive, and the single-ended peak signal PEAK is the differential voltage input signal A_N at this point. In this way, the signal peak detector circuit 30 may obtain the single-ended peak signal PEAK via sample and hold of the switch circuits 300 and 310.

Figure 4:
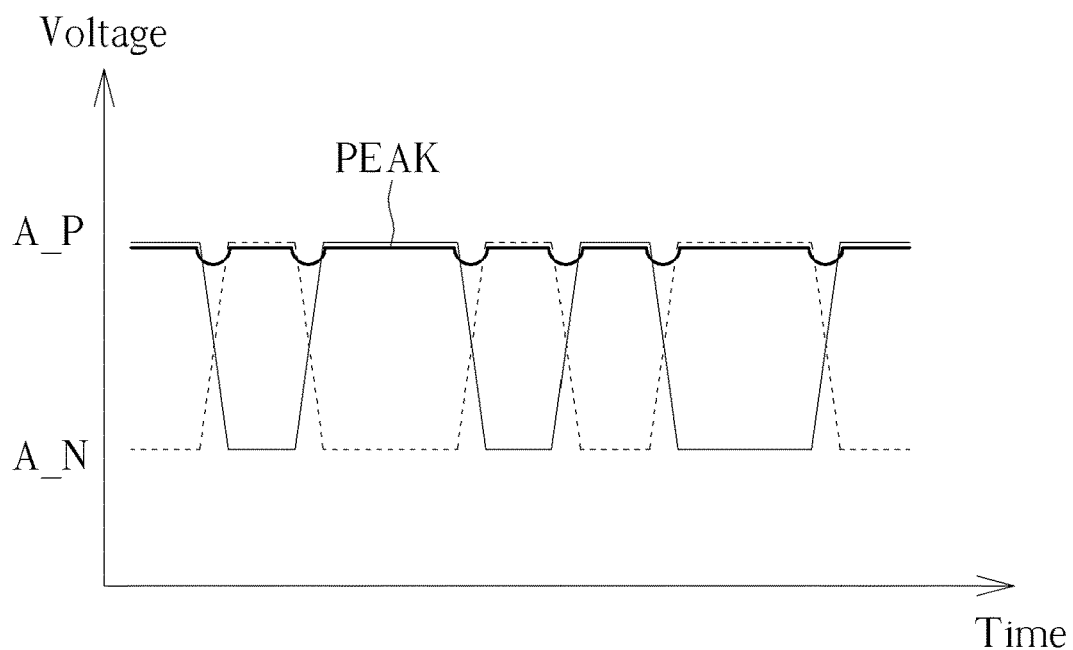
FIG. 4 is a diagram illustrating a single-ended peak signal generated by the signal peak detector circuit shown in FIG. 3 according to an embodiment of the present invention.

FIG. 4 is a diagram illustrating the single-ended peak signal PEAK generated by the signal peak detector circuit 30 shown in FIG. 3 according to an embodiment of the present invention, wherein the horizontal axis of the diagram represents time, and the vertical axis of the diagram represents voltage. As shown in FIG. 4, when the differential voltage input signal A_P is the high level and the differential voltage input signal A_N is the low level, the single-ended peak signal PEAK is the differential voltage input signal A_P. When the differential voltage input signal A_P is the low level and the differential voltage input signal A_N is the high level, the single-ended peak signal PEAK is the differential voltage input signal A_N. For brevity, similar descriptions for this embodiment are not repeated in detail here.

Figure 5:
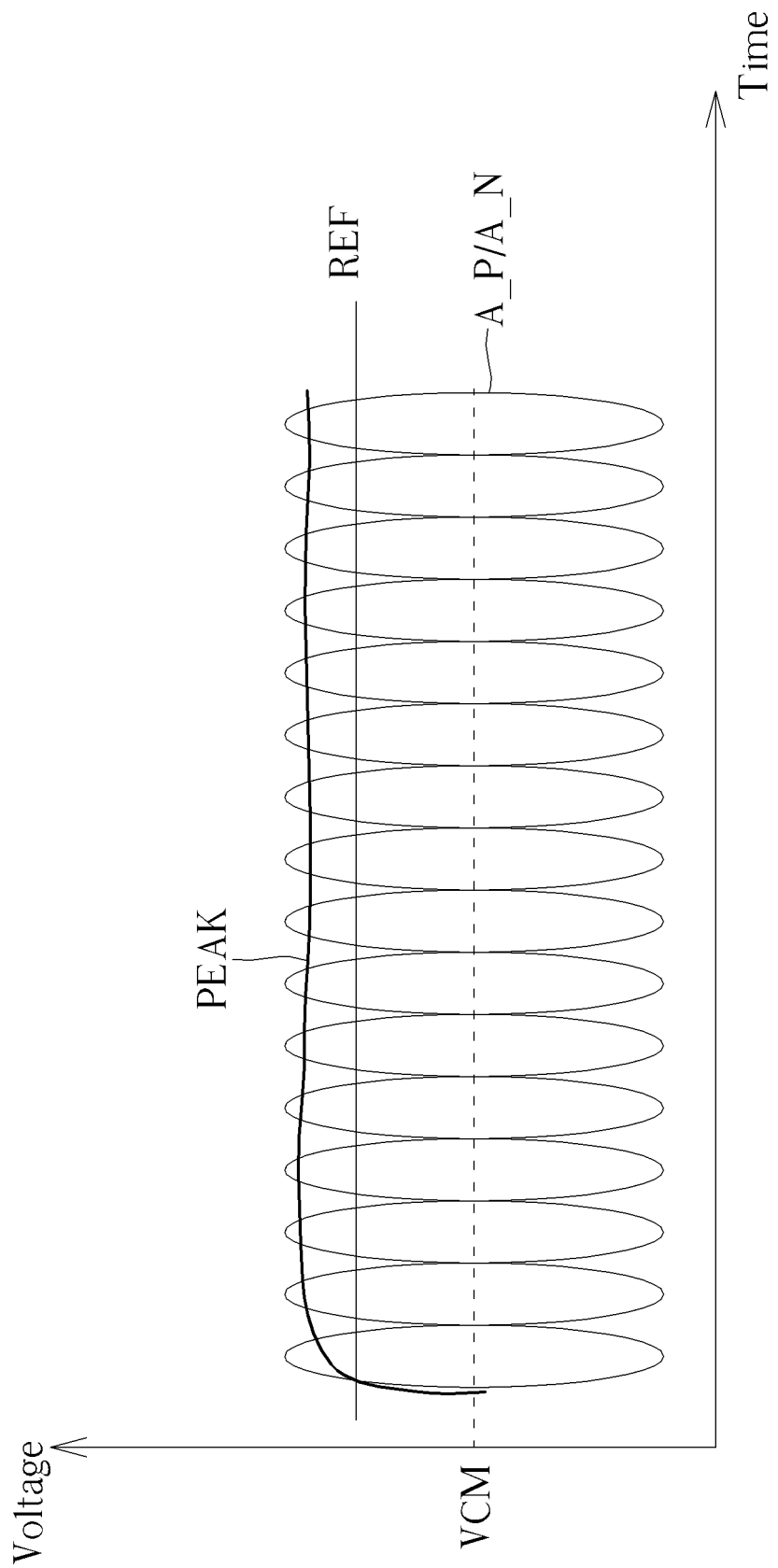
FIG. 5 is a diagram illustrating associated signals of the signal detector circuit shown in FIG. 2 according to an embodiment of the present invention.

FIG. 5 is a diagram illustrating associated signals of the signal detector circuit 20 shown in FIG. 2 according to an embodiment of the present invention, wherein the horizontal axis of the diagram represents time, and the vertical axis of the diagram represents voltage. As shown in FIG. 5, the single-ended peak signal PEAK is generated by signal-ended detection, and the single-ended reference voltage signal REF may be generated according to circuit design requirements. It is determined whether the differential voltage input signals A_P and A_N are noise according to the signal detection result COMP generated by the comparator circuit 220. For example, in response to the signal detection result COMP indicating that the voltage value of the single-ended peak signal PEAK is smaller than that of the single-ended reference voltage signal REF, the differential voltage input signals A_P and A_N will be determined as noise. Otherwise, in response to the signal detection result COMP indicating that the voltage value of the single-ended peak signal PEAK is not smaller than that of the single-ended reference voltage signal REF, the differential voltage input signals A_P and A_N will be determined as valid signals from other devices. For brevity, similar descriptions for this embodiment are not repeated in detail here.

Figure 6:
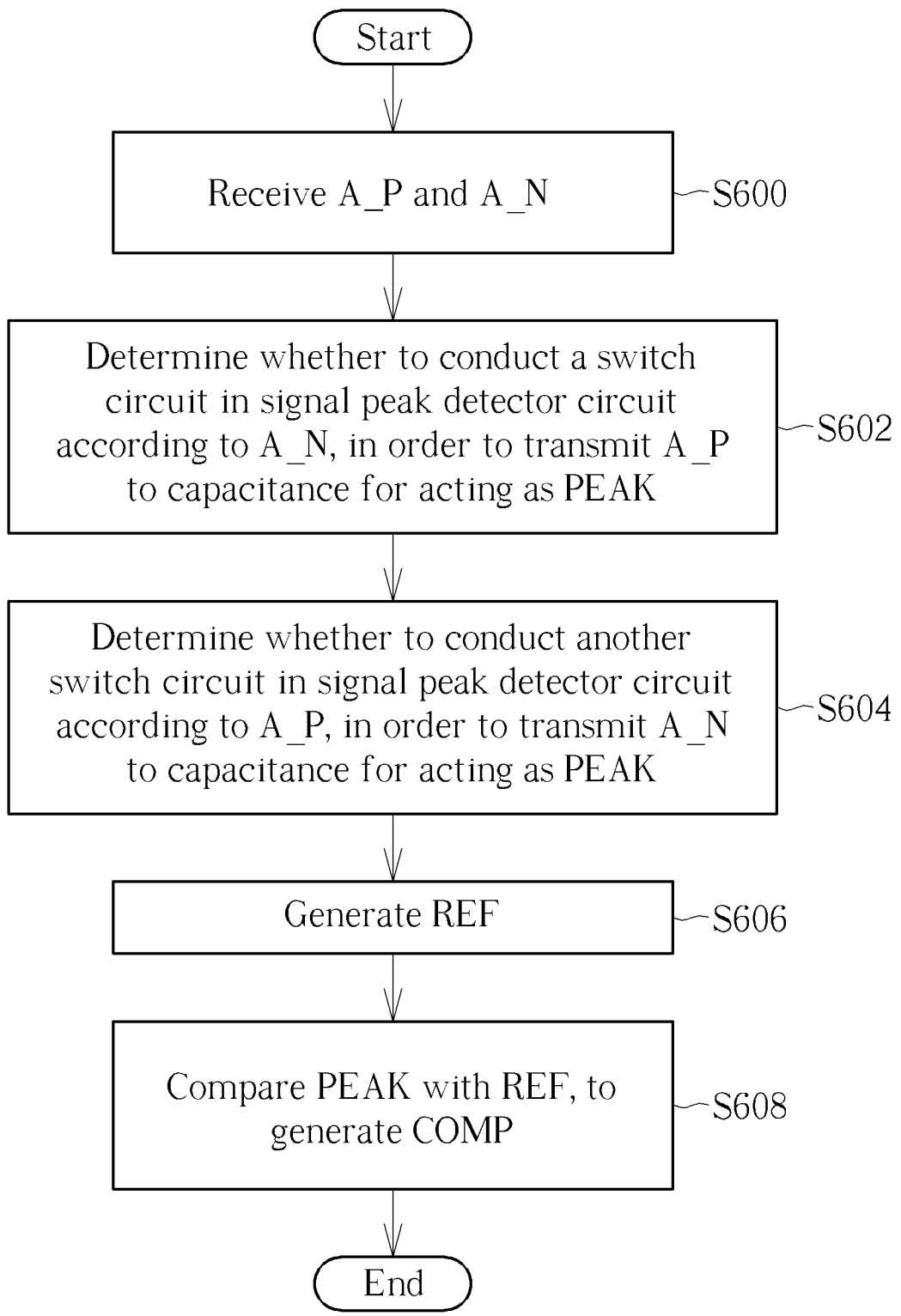
FIG. 6 is a flow chart of a signal detection method according to an embodiment of the present invention.

FIG. 6 is a flow chart of a signal detection method according to an embodiment of the present invention. Provided that the result is substantially the same, the steps are not required to be executed in the exact order shown in FIG. 6. For example, the signal detection method shown in FIG. 6 may be employed by the signal detector signal 20 shown in FIG. 2, wherein the signal peak detector circuit 200 in the signal detector signal 20 is implemented by the signal peak detector circuit 30 shown in FIG. 3.

In Step S600, the signal peak detector circuit 30 receives the differential voltage input signals A_P and A_N.

In Step S602, the signal peak detector circuit 30 determines whether to conduct a switch circuit (e.g. the switch circuit 300) in the signal peak detector circuit 30 according to the differential voltage input signal A_N, in order to transmit the differential voltage input signal A_P to the first end of the capacitance 320 for acting as the single-ended peak signal PEAK.

In Step S604, the signal peak detector circuit 30 determines whether to conduct another switch circuit (e.g. the switch circuit 310) in the signal peak detector circuit 30 according to the differential voltage input signal A_P, in order to transmit the differential voltage input signal A_N to the first end of the capacitance 320 for acting as the single-ended peak signal PEAK.

In Step S606, the reference voltage generation circuit 210 generates the single-ended reference voltage signal REF.

In Step S608, the comparator circuit 220 compares the single-ended peak signal PEAK with the single-ended reference voltage signal REF to generate the signal detection result COMP.

Since a person skilled in the pertinent art can readily understand details of the steps after reading above paragraphs directed to the signal detector circuit 20 and the signal peak detector circuit 30, further description is omitted here for brevity.

In summary, since the signal detector circuit of the present invention utilizes architecture that does not operate according to the input common mode voltage, an additional common mode voltage generation circuit is not required, and a reference voltage generation circuit to make the common mode voltage of the differential reference voltage signal the same as that of the differential input signal is also not required. In this way, the signal detector circuit of the present invention can reduce the amount of parasitic capacitance affecting the high speed signal to maintain the signal quality of high speed data transmissions while reducing the chip area. In addition, the signal detector circuit of the present invention adopts single-ended detection. As a result, compared with a signal detector circuit with architecture related to the common mode voltage, the signal detector circuit of the present invention can reduce the parasitic capacitance of the input terminal by half.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal detector circuit, comprising:
a signal peak detector circuit, arranged to receive a plurality of differential voltage input signals, and generate a single-ended peak signal according to the plurality of differential voltage input signals;
a reference voltage generation circuit, arranged to generate a single-ended reference voltage signal; and
a comparator circuit, arranged to receive the single-ended peak signal and the single-ended reference voltage signal, and compare the single-ended peak signal with the single-ended reference voltage signal, to generate a signal detection result;
wherein the signal peak detector circuit comprises multiple switch circuits, and the signal peak detector circuit samples and holds the plurality of differential voltage input signals by conducting the multiple switch circuits, to generate the single-ended peak signal.

2. The signal detector circuit of claim 1, wherein the plurality of differential voltage input signals comprises a first differential voltage input signal and a second differential voltage input signal, and the multiple switch circuits comprise:
a first switch circuit, having a first end and a second end, wherein the first end of the first switch circuit is arranged to receive the first differential voltage input signal, and the first switch circuit is conductive according to a first control signal, for transmitting the first differential voltage input signal to the second end of the first switch circuit; and
a second switch circuit, having a first end and a second end, wherein the first end of the second switch circuit is arranged to receive the second differential voltage input signal, and the second switch circuit is conductive according to a second control signal, for transmitting the second differential voltage input signal to the second end of the second switch circuit;
wherein the signal peak detector circuit further comprises:
a capacitance, having a first end and a second end, and arranged to output the single-ended peak signal, wherein the first end of the capacitance is coupled to the second end of the first switch circuit and the second end of the second switch circuit, and the second end of the capacitance is coupled to a reference voltage.

3. The signal detector circuit of claim 2, wherein the first control signal is the second differential voltage input signal, and the second control signal is the first differential voltage input signal.

4. The signal detector circuit of claim 3, wherein when the first differential voltage input signal is a first level and the second differential voltage input signal is a second level that is lower than the first level, the first switch circuit is conductive and the second switch circuit is not conductive, and the single-ended peak signal is the first differential voltage input signal.

5. The signal detector circuit of claim 3, wherein when the first differential voltage input signal is a first level and the second differential voltage input signal is a second level that is higher than the first level, the first switch circuit is not conductive and the second switch circuit is conductive, and the single-ended peak signal is the second differential voltage input signal.

6. A signal detection method, comprising:
receiving a plurality of differential voltage input signals;
generating a single-ended peak signal according to the plurality of differential voltage input signals;
generating a single-ended reference voltage signal; and
comparing the single-ended peak signal with the single-ended reference voltage signal to generate a signal detection result;
wherein generating the single-ended peak signal according to the plurality of differential voltage input signals comprises:
sampling and holding the plurality of differential voltage input signals by conducting multiple switch circuits, to generate the single-ended peak signal.

7. The signal detection method of claim 6, wherein the plurality of differential voltage input signals comprises a first differential voltage input signal and a second differential voltage input signal, the multiple switch circuits comprise a first switch circuit and a second switch circuit; and sampling and holding the plurality of differential voltage input signals by conducting the multiple switch circuits, to generate the single-ended peak signal comprises:
conducting the first switch circuit according to a first control signal, for transmitting the first differential voltage input signal to a first end of a capacitance; and
conducting the second switch circuit according to a second control signal, for transmitting the second differential voltage input signal to the first end of the capacitance;
wherein the capacitance is arranged to output the single-ended peak signal, and a second end of the capacitance is coupled to a reference voltage.

8. The signal detection method of claim 7, wherein the first control signal is the second differential voltage input signal and the control signal is the first differential voltage input signal.

9. The signal detection method of claim 8, wherein when the first differential voltage input signal is a first level and the second differential voltage input signal is a second level that is lower than the first level, the first switch circuit is conductive and the second switch circuit is not conductive, and the single-ended peak signal is the first differential voltage input signal.

10. The signal detection method of claim 8, wherein when the first differential voltage input signal is a first level and the second differential voltage input signal is a second level that is higher than the first level, the first switch circuit is not conductive and the second switch circuit is conductive, and the single-ended peak signal is the second differential voltage input signal.

* * * * *